United States Patent
Tian et al.

(10) Patent No.: US 10,586,690 B2
(45) Date of Patent: Mar. 10, 2020

(54) MAGNETRON SPUTTERING DEVICE, MAGNETRON SPUTTERING APPARATUS AND MAGNETRON SPUTTERING METHOD

(71) Applicant: BOE TECHNOLOGY GROUP CO., LTD., Beijing (CN)

(72) Inventors: Zhongpeng Tian, Beijing (CN); Xuewei Gao, Beijing (CN); Lei Xiao, Beijing (CN); Jianhua Du, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 169 days.

(21) Appl. No.: 15/541,883

(22) PCT Filed: Jan. 3, 2017

(86) PCT No.: PCT/CN2017/000012
§ 371 (c)(1),
(2) Date: Jul. 6, 2017

(87) PCT Pub. No.: WO2017/185810
PCT Pub. Date: Nov. 2, 2017

(65) Prior Publication Data
US 2018/0277344 A1 Sep. 27, 2018

(30) Foreign Application Priority Data
Apr. 29, 2016 (CN) .......................... 2016 1 0282313

(51) Int. Cl.
*H01J 37/34* (2006.01)
*C23C 14/35* (2006.01)
*C23C 14/54* (2006.01)

(52) U.S. Cl.
CPC .......... *H01J 37/3479* (2013.01); *C23C 14/35* (2013.01); *C23C 14/54* (2013.01); *H01J 37/3405* (2013.01); *H01J 37/3455* (2013.01)

(58) Field of Classification Search
CPC ............... H01J 37/3479; H01J 37/3455; H01J 37/3405; C23C 14/35; C23C 14/54
(Continued)

(56) References Cited

U.S. PATENT DOCUMENTS

| 2014/0069802 A1* | 3/2014 | Yih | H01J 37/3405 204/192.12 |
|---|---|---|---|
| 2016/0186312 A1 | 6/2016 | Wang et al. | |

FOREIGN PATENT DOCUMENTS

| CN | 201006891 Y | 1/2008 |
|---|---|---|
| CN | 101542013 A | 9/2009 |

(Continued)

OTHER PUBLICATIONS

Search Report and Written Opinion dated Mar. 23, 2017 from State Intellectual Property Office of the P.R. China.
Chinese Office Action dated Nov. 24, 2017.

*Primary Examiner* — Rodney G McDonald
(74) *Attorney, Agent, or Firm* — Dilworth & Baresse, LLP.; Michael J. Musella, Esq.

(57) ABSTRACT

A magnetron sputtering device, a magnetron sputtering apparatus, and a magnetron sputtering method are provided. The magnetron sputtering device includes: a target material bearing portion, configured to bear a target material thereon; a magnet bearing section, configured to bear a magnet thereon and to be capable of driving the magnet to perform reciprocating motion along a predetermined path with respect to the target material bearing portion; a limit sensor, configured to determine an end-point position of the predetermined path along which the magnet performs reciprocating motion; the end-point position determined by the limit (Continued)

sensor can be adjusted along the predetermined path during a working procedure of the magnetron sputtering device.

12 Claims, 3 Drawing Sheets

(58) Field of Classification Search
USPC .......................... 204/298.2, 192.13, 298.03
See application file for complete search history.

(56) References Cited

FOREIGN PATENT DOCUMENTS

| | | |
|---|---|---|
| CN | 101988188 A | 3/2011 |
| CN | 104114741 A | 10/2014 |
| CN | 104404466 A | 3/2015 |
| CN | 104498886 A | 4/2015 |
| CN | 205077129 U | 3/2016 |
| CN | 105803410 A | 7/2016 |
| JP | 200230433 A | 1/2002 |
| WO | 2014024344 A1 | 2/2014 |

* cited by examiner

MAGNETRON SPUTTERING DEVICE, MAGNETRON SPUTTERING APPARATUS AND MAGNETRON SPUTTERING METHOD

TECHNICAL FIELD

Embodiments of the present disclosure relate to a magnetron sputtering device, a magnetron sputtering apparatus, and a magnetron sputtering method.

BACKGROUND

Magnetron sputtering is widely used in fields such as an integrated circuit, a liquid crystal display, thin film solar energy, and so on. Charged particles (for example argon ions) accelerate to bombard a target material under action of electric field and sputter out a large number of atoms of the target material, neutral target atoms (or molecules) are deposited on a substrate to form a film; electrons are bounded to a plasma region close to a target surface under a combined action of an electric field force and a magnetic field force, and performs reciprocating motion around the target surface under the action of the magnetic field force. The electrons, in a course of motion, constantly collide with the argon atoms, with a large number of argon ions ionized out to bombard the target material, so that the sputtering can be performed uniformly at a high speed, and accordingly a uniform magnetic field is a key that the target material can be uniformly sputtered, and can have a prolonged service life.

Figure 1:
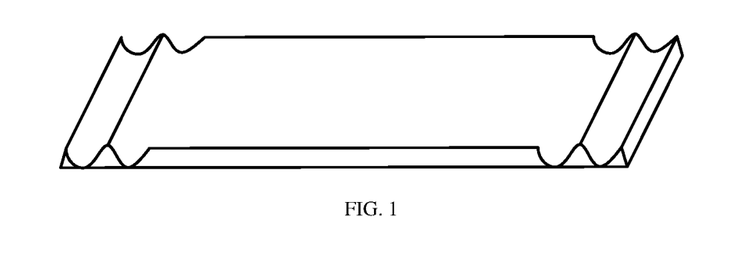
FIG. 1 is a schematic diagram of a target material with a continuous "U"-shaped dent formed thereon in the prior art.

The uniform magnetic field can be generated by the high-speed reciprocating motion of a magnet. In a case that the magnet moves to an edge of a rail, it needs to stand still and then return. In a case that the magnet stands still, since a center magnetic field is weak and an edge magnetic field is strong, and a continuous "U"-shaped dent is formed in a position corresponding to a standstill position of the magnet on the target material. FIG. 1 illustrated a schematic diagram of forming the continuous "U"-shaped dent on the target material. With consumption of the target material, the target material is apt to be punctured at a lowest point of the "U"-shaped dent, resulting in an end of the service life of the target material, however, in other positions, the target material has not been fully utilized yet, which results in a lower utilization of the target material.

On the other hand, a thickness of the deposited thin film on the processed substrate is required to be small and uniform, and different parts of the target material are subjected to different intensities and frequencies of bombardment, resulting in different amounts of sputtered material; moreover, rates for depositing the thin film on the processed substrate, and thicknesses of the thin film are both different, which ultimately affects uniformity of the thin film on the processed substrate.

SUMMARY

At least one embodiment of the present disclosure provides a magnetron sputtering device, and the magnetron sputtering device comprises: a target material bearing portion, configured to bear a target material thereon; a magnet bearing section, configured to bear a magnet thereon and to be capable of driving the magnet to perform reciprocating motion along a predetermined path with respect to the target material bearing portion; a limit sensor, configured to determine an end-point position of the predetermined path along which the magnet performs reciprocating motion; the end-point position determined by the limit sensor can be adjusted along the predetermined path during a working procedure of the magnetron sputtering device.

At least one embodiment of the present disclosure further provides a magnetron sputtering apparatus, and the magnetron sputtering apparatus comprises: a reaction chamber and a magnetron sputtering device disposed in the reaction chamber and provided by any one of the embodiments of the present disclosure.

At least one embodiment of the present disclosure further provides a magnetron sputtering method, and the method comprises: receiving and analyzing a signal of a consumption amount of the target material or sending an instruction to the limit sensor according to a predetermined working time period, to change an end-point position of the predetermined path along which the magnet performs reciprocating motion through the limit sensor by a control module; receiving and analyzing a signal fed back by the limit sensor, and then sending an instruction to the magnet bearing section, to control the magnet bearing section to drive the magnet to perform reciprocating motion along the predetermined path with respect to the target material by the control module; the end-point position determined by the limit sensor can be adjusted along the predetermined path during a working procedure of the magnetron sputtering device.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Over," "under," "right," "left" and the like are only used to indicate relative position relationship, and when the position of the object which is described is changed, the relative position relationship may be changed accordingly.

At least one embodiment of the present disclosure provides a magnetron sputtering device, a magnetron sputtering apparatus comprising the magnetron sputtering device and a magnetron sputtering method. The magnetron sputtering device comprises: a target material bearing portion, which is configured to bear a target material thereon; a magnet bearing section, which is configured to bear a magnet thereon and to be capable of driving the magnet to perform reciprocating motion along a predetermined path with respect to the target material bearing portion; a limit sensor, which is configured to determine an end-point position of the predetermined path along which the magnet performs reciprocating motion; and the end-point position determined by the limit sensor can be adjusted along the predetermined path during a working procedure of the magnetron sputtering device.

The magnetron sputtering device is capable of adjusting a position of the limit sensor according to a predetermined condition, to determine the end-point position of the reciprocating motion of the magnet, so as to improve uniformity of bombardment to the target material and to avoid waste caused by premature replacement of the target material, that is, to prolong a service life of the target material.

Figure 2:
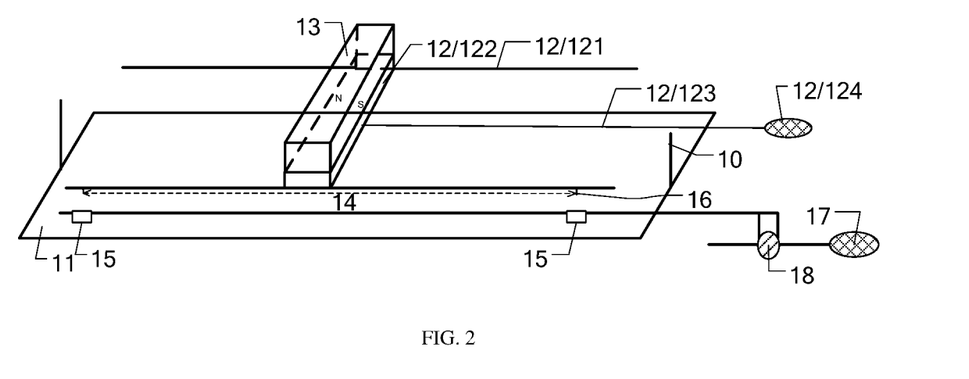
FIG. 2 is a structural schematic diagram of a magnetron sputtering device provided by an embodiment of the present disclosure.

At least one embodiment of the present disclosure provides a magnetron sputtering device, and FIG. 2 is a structural schematic diagram of the magnetron sputtering device provided by the embodiment of the present disclosure. The magnetron sputtering device comprises: a target material bearing portion 10, which is configured to bear a target material 11 thereon; a magnet bearing section 12, which is configured to bear a magnet 13 thereon and to be capable of driving the magnet 13 to perform reciprocating motion along a predetermined path 14 with respect to the target material bearing portion 12 (also with respect to the target material 11); a limit sensor 15, which is configured to determine an end-point position 16 of the predetermined path 14 along which the magnet 13 performs the reciprocating motion; the end-point position 16 determined by the limit sensor 15 can be adjusted along the predetermined path 14 during a working procedure of the magnetron sputtering device.

The target material bearing portion 10 and the magnet bearing section 12 can be arranged in parallel, so as to implement that both the magnet 13 and the target material 11 are, for example, parallel to a plane (e.g., ground) where a base of the magnetron sputtering device is located, the magnet 13 is provided above the target material 11, the magnet 13 moves in parallel to the target material 11 along the predetermined path 14, or alternatively, both the magnet 13 and the target material 11 are perpendicular to the plane where the base of the magnetron sputtering device is located, so as to implement that the magnet 13 and the target material 11 are provided in parallel, and the magnet 13 moves in parallel to the target material 11 along the predetermined path 14. Both of the arrangement modes are applicable to the embodiments of the present disclosure, and they differ only in that: in a case that both the magnet 13 and the target material 11 are perpendicular to the plane where the base of the magnetron sputtering device is located, so that they are arranged in parallel, in a case that the target moves in parallel to the target material 11 along the predetermined path 14, the magnet 13 needs to overcome gravity of the magnet 13 itself to move. Hereinafter, the magnetron sputtering device is described with a case that both the magnet 13 and the target material 11 are provided in parallel to the plane where the base of the magnetron sputtering device is located as an example.

For example, the target material bearing portion 10 may include a card slot or a support frame, etc., for bearing and fixing the target material 11. The target material bearing portion 10 may be an adjustable fixing device, and thus, the target material bearing portion 10 may be used for bearing different sizes of target materials 11. The target material 11 may be different types of material according to requirements, for example, a metal material (an elementary substance or an alloy material), and may be prepared into a desired shape, for example, a rectangle.

For example, as illustrated in FIG. 2, the magnet bearing section 12 includes: a guide rail 121, a magnet supporting piece 122, a connecting piece 123, and a power element 124, the power element 124 is capable of driving the magnet supporting piece 122 to mobilize the magnet 13 to move on the guide rail 121.

For example, the limit sensor 15 may be a proximity sensor of a magnetic force type, the sensor is provided with a conductor, and the conductor is an iron sheet or an aluminum sheet, and the like. The magnet supporting piece 122 may be a slider; and in a case that the slider 13 mobilizes the magnet 13 to move on the guide rail 121, and in a case that the magnet 13 passes through the limit sensor 15, the conductor on the limit sensor 15 may cut a line of magnetic force generated by the magnet to produce an induced current, and the limit sensor 15 may sense the induced current generated by the conductor cutting the line of magnetic force, to obtain a position signal of the magnet 13. The proximity sensor of the magnetic force type does not need power, which is a non-contact type sensor, the proximity sensor of the magnetic force type does not need maintenance, which is environmentally-friendly, and will neither wear a detection object, nor affect normal movement of the magnet.

For example, the limit sensor 15 may be a proximity sensor of a photoelectric type, and the limit sensor 15 comprises: a light-emitting device (for example, a laser light-emitting device) and a detector. In a case that there is a reflective surface (the magnet) approaching, the proximity sensor of the photoelectric type receives a reflected light signal, to obtain the position signal of the magnet 13. The proximity sensor of the photoelectric type is also a non-contact type sensor, which will neither wear the detection object nor affect the normal movement of the magnet.

For example, the limit sensor 15 may be a proximity sensor of an ultrasonic type, and the limit sensor 15 periodically emits an ultrasonic pulse. In a case that the magnet approaches, reflected waves formed by these pulses reflected by the magnet are received and converted into an electrical signal, an intensity of the reflected wave depends on a distance between the magnet and the limit sensor 15, so that the position signal of the magnet 13 can be obtained.

For example, the limit sensor 15 may also be a limit switch, and the limit switch may convert mechanical displacement of the magnet into an electrical signal, so that a motion state of the magnet bearing section 12 is changed, so as to control a motion state of the magnet.

For example, the guide rail 121 may be a low resistance rail. For example, the guide rail 121 may be a magnetic levitation rail, and an electromagnetic repulsive force is generated between the magnetic levitation rail and the magnet supporting piece 122, to hold up the magnet supporting piece in a suspended state. The magnet supporting piece mobilizes the magnet 13 to move on the magnetic levitation rail, which can reduce a mechanical frictional force, improve a rate at which the magnet 13 performs high-speed reciprocating motion, and at the same time, reduce a requirement on the power element 124. For example, in a case that the magnet 13 moves on the guide rail 121, if resistance is relatively large, it is necessary to use a motor having a large power; and if it is a low resistance rail, for example, the power element 124 may be an air cylinder or a hydraulic cylinder of variable stroke, and the like.

For example, the magnet bearing section 12 may also comprise an eccentric wheel (not illustrated in FIG. 2) and an eccentric wheel follower (not illustrated in FIG. 2) cooperating with the eccentric wheel, the magnet 13 is connected with the eccentric wheel follower, and mobilizes the magnet 13 to move through movement of the eccentric wheel follower at an outer edge of the eccentric wheel.

For example, the magnet bearing section 12 may include a driving gear (not illustrated in FIG. 2) and a driven rack (not illustrated in FIG. 2) cooperating with the driving gear, the magnet 13 is connected with the driven rack, and mobilizes the magnet 13 to move through relative movement of the driven rack and the driving gear.

For example, the magnet 13 may be composed of a plurality of magnet units, and in two adjacent magnet units, sides of the two adjacent magnet units having opposite magnetic properties may be arranged adjacent to each other. For example, as illustrated in FIG. 2, an upper surface of the magnet 13 is an N pole and a lower surface is an S pole. A size of the magnet 13 may be selected in comprehensive consideration of the bombarded target material 11 and the processed substrate. For example, the bombarded target material 11 has a length of 610 mm and a width of 550 mm, the processed substrate has a length of 470 mm and a width of 370 mm, and accordingly, the selected magnet 13 has a length of 500 mm and a width of 15 mm. For example, the length of the magnet 13 is larger than the length of the processed substrate, and is smaller than the length of the bombarded target material 11, the width of the magnet is smaller than 1/10 of the width of the processed substrate, and a range of the width of the magnet 13 to move in parallel to the target material 11 is within a range of the widths of the target material 11 and the processed substrate.

Figure 3:
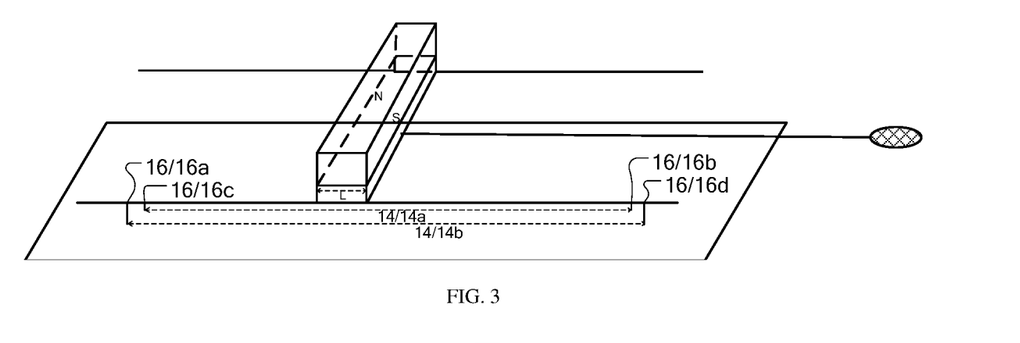
FIG. 3 is a working exemplary diagram of a magnetron sputtering device provided by an embodiment of the present disclosure.

For example, FIG. 3 is a working exemplary diagram of the magnetron sputtering device provided by the embodiment of the present disclosure. A side length of the magnet 13 in an extending direction of the predetermined path 14/14a or 14/14b is L, end-point positions 16/16a and 16/16b determined by the limit sensor 15 are adjusted respectively on a left side and on a right side along the predetermined path 14/14a during the working procedure of the magnetron sputtering device, for example, after the magnet 13 performs reciprocating motion along the predetermined path 14/14a for a period of time, the position of the limit sensor 15 is adjusted to form a new predetermined path 14/14b. The new predetermined path 14/14b has new end-point positions 16/16c and 16/16d which are respectively corresponding to the end-point positions 16/16a and 16/16b, a distance between 16/16a and 16/16c is within 0 to L; and a distance between 16/16b and 16/16d is 0 to L.

For example, after the magnet 13 performs reciprocating motion along the predetermined path 14/14b for a period of time, the position of the limit sensor 15 is adjusted to form a predetermined path again, the predetermined path may be the previous predetermined path 14/14a, and accordingly, the end-point positions determined by the limit sensor 15 are 16/16a and 16/16b; and the predetermined path may also be another new predetermined path other than the predetermined path 14/14a and the predetermined path 14/14b, and accordingly, a composition of the end-point positions is also changed.

For example, as illustrated in FIG. 3, in a case that the distance between 16/16a and 16/16c is L/2, and the magnet 13 performing reciprocating motion along the predetermined path 14/14a stands still in the end-point position 16/16a, it is assumed that bombardment to the target material in position S1 is the strongest; and in a case that the magnet 13 performing reciprocating motion along the predetermined path 14/14b stands still in the end-point position 16/16c, bombardment to the target material in position S1 is the weakest. Similarly, in a case that the distance between 16/16b and 16/16d is L/2, and the magnet 13 performing reciprocating motion along the predetermined path 14/14a stands still in the end-point position 16/16b, it is assumed that bombardment to the target material in position S2 is the strongest; and in a case that the magnet 13 performing reciprocating motion along the predetermined path 14/14b stands still in the end-point position 16/16d, bombardment to the target material in position S2 is the weakest. Other distances from 0 to L other than L/2, for example: L/8, L/4, L/3, 2L/5, 3L/4 and 7L/8 etc., also have a certain effect on improvement in uniformity of bombardment to the target material, but by selecting the distance of L/2, the uniformity of bombardment to the target material can be improved to the largest extent, and the service life of the target material is prolonged to the largest extent.

For example, as illustrated in FIG. 3, if the distance between 16/16a and 16/16c is larger than L, and the magnet 13 performing reciprocating motion along the predetermined path 14/14a stands still in the end-point position 16/16a, it is assumed that bombardment to the target material in position S1 is the strongest; and in a case that the magnet 13 performing reciprocating motion along the new predetermined path 14/14b stands still in the end-point position 16/16c, there may be no bombardment to the target material in position S1 and a side of S1 away from 16/16c, which will lead to a waste of the target material, and at the same time, will lead to non-uniform deposition of the thin film on a processed workpiece, so as to affect final product quality.

For example, the magnetron sputtering device may further comprise a control module. The working procedure of the magnetron sputtering device further comprises: the control module (not illustrated in FIG. 3) receives and analyzes a signal of a consumption amount of the target material or sends an instruction to the limit sensor according to a predetermined working time period, the limit sensor receives the instruction and obtains a predetermined distance along which it moves parallel to the predetermined path, so that the limit sensor 15 can determine the end-point position of the predetermined path 14 along which the magnet 13 performs reciprocating motion. In a case that the limit sensor 15 receives the position signal of the magnet and feeds back to the control module, the control module accepts and analyzes the signal fed back by the limit sensor, and then sends an instruction to the magnet bearing section 11, to determine the motion state of the magnet. The consumption amount of the target material can be obtained according to a set sputtering power and a program set by a working time application, or obtained by photographing an image of the target material and then by analyzing the image.

In one example, for example, as illustrated in FIG. 2, the limit sensor 15 is set to be movable, so that its position with respect to the predetermined path 14, for example, the position along the predetermined path 14, may be changed. The end-point position 16 of the predetermined path 14 along which the magnet 13 performs reciprocating motion is determined by a change of the position of the limit sensor 15 with respect to the predetermined path 14, and the end-point position 16 determined by the limit sensor 15 may be adjusted along the predetermined path 14 during the working procedure of the magnetron sputtering device. There is a limit sensor 15 respectively in the end-point positions of both ends of the predetermined path 14 along which the magnet 13 performs reciprocating motion.

For example, as illustrated in FIG. 2, the magnetron sputtering device further comprises: a first driving unit 17, which is configured to provide a driving force for the movement of the limit sensor 15; and a connecting part 18, which is connected with the first driving unit 17 and the limit sensor 15. The limit sensor 15 is disposed on the connecting part 18, and the first driving unit 17 mobilizes adjustment of the connecting part 18, and at the same time, mobilizes adjustment of the limit sensor 15, so that the end-point position 16 of the predetermined path 14 along which the magnet 13 performs reciprocating motion is determined by the change of the position of the movable limit sensor 15 with respect to the predetermined path 14.

For example, as illustrated in FIG. 2, the first driving unit 17 is a rotating motor or a gear fitting, the connecting part 18 is a lead screw or a rack correspondingly, and the limit sensor 15 is disposed on the lead screw or the rack. The rotating motor or the gear fitting provides rotational power, and the lead screw or the rack can transform the rotational motion into a linear motion, so as to change the position of the limit sensor 15 with respect to the predetermined path 14. There is a limit sensor 15 respectively in the end-point positions of both ends of the predetermined path 14 along which the magnet 13 performs reciprocating motion. The two limit sensors 15 are connected with a same connecting part 18, and the first driving unit 17 mobilizes the two limit sensors 15 on the connecting part 18 to move simultaneously.

For example, the first driving unit 17 may be a linear motor or an air cylinder or a hydraulic cylinder of variable stroke, the connecting part 18 is a telescopic rod, and the limit sensor is disposed on the telescopic rod. The linear motor or the air cylinder or the hydraulic cylinder of variable stroke respectively provide linear power, which can directly change the position of the limit sensor 15 with respect to the predetermined path 14.

Figure 4:
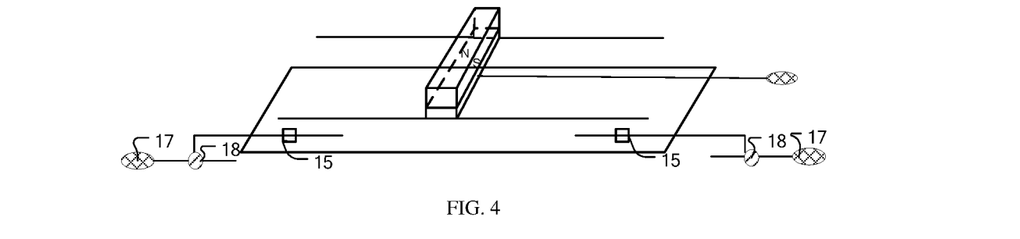
FIG. 4 is a structural schematic diagram of a magnetron sputtering device provided by an embodiment of the present disclosure.

For example, FIG. 4 is a structural schematic diagram of a magnetron sputtering device provided by an embodiment of the present disclosure. The two limit sensors 15 are respectively connected with two connecting parts 18 which are not connected with each other, and the two connecting parts 18 are respectively driven by a first driving unit 17. For example, the first driving unit 17 is a rotating motor or a gear fitting, the connecting part 18 is a lead screw or a rack correspondingly, so as to respectively mobilize adjustment of the limit sensors 15 provided thereon. Similarly, the first driving unit 17 may also be a linear motor or an air cylinder or a hydraulic cylinder of variable stroke, and the connecting part 18 is a telescopic rod, and detailed descriptions will be omitted herein.

Figure 5:
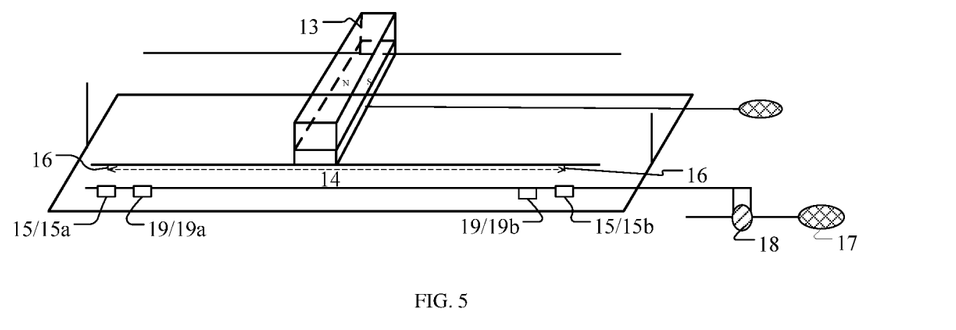
FIG. 5 is a structural schematic diagram of a magnetron sputtering device provided by an embodiment of the present disclosure.

For example, the magnet performs high-speed reciprocating motion along the predetermined path can improve uniformity of the magnetic field; and in a case that the magnet changes from a state of high-speed motion to a state of stop, the magnet can be previously decelerated before moving to the end-point position. For example, FIG. 5 is a structural schematic diagram of a magnetron sputtering device provided by an embodiment of the present disclosure. The magnetron sputtering device, with respect to the embodiment illustrated in FIG. 2, further comprises: a deceleration sensor 19, the deceleration sensor 19 is, for example, disposed on the predetermined path 14 and located before the end-point position 16. Therefore, in a case that the magnet 13 moves along the predetermined path 14, and before it arrives at the end-point positions of both ends, it always passes through a deceleration position determined by the deceleration sensor 19 previously, the deceleration position determined by the deceleration sensor 19 may be adjusted along the predetermined path 14 during a working procedure of the magnetron sputtering device.

For example, both the limit sensor 15 and the deceleration sensor 19 are configured to be capable of simultaneously moving, so as to change their positions with respect to the predetermined path 14. It includes two cases: the limit sensors 15/15a and 15/15b and the deceleration sensors 19/19a and 19/19b are configured to be capable of moving simultaneously, so as to change their positions with respect to the predetermined path 14; and a combination of the limit sensor 15/15a and the deceleration sensor 19/19a and a combination of the limit sensor 15/15b and the deceleration sensor 19/19b are configured to be respectively moved, so as to change their positions with respect to the predetermined path 14.

For example, a distance between the limit sensor 15 and the deceleration sensor 19 corresponding thereto is between L/2 to 2L. As illustrated in FIG. 5, a distance between the limit sensor 15/15a and the deceleration sensor 19/19a corresponding thereto is between L/2 to 2L; and a distance between the limit sensor 15/15b and the deceleration sensor 19/19b corresponding thereto is between L/2 to 2L.

Figure 6:
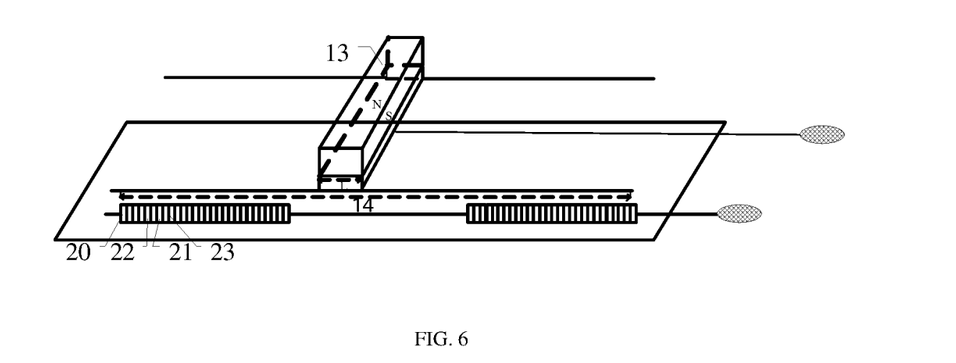
FIG. 6 is a structural schematic diagram of a magnetron sputtering device provided by an embodiment of the present disclosure.

At least one embodiment of the present disclosure provides another magnetron sputtering device, for example, FIG. 6 is another structural schematic diagram of the magnetron sputtering device provided by the embodiment of the present disclosure. The magnetron sputtering device also has a plurality of sensor units provided at different positions along the predetermined path, and a first sensor unit 20 in the sensor units may be selectively activated according to requirements, to be used as a limit sensor, so as to determine the end-point position of the predetermined path along which the magnet 13 performs reciprocating motion. It should be noted that, the first sensor unit 20 is not the "first" sensor unit, but any suitable sensor unit that is selected according to requirements.

Since the magnet performing the reciprocating motion along the predetermined path can improve uniformity of the magnetic field, in a case that the magnet changes from a state of high-speed motion to a state of stop, the magnet can be previously decelerated before moving to the end-point position. For example, as illustrated in FIG. 6, the magnetron sputtering device further comprises a deceleration sensor, the deceleration sensor is disposed on the predetermined path 14 and is located before the end-point position. In a case that the magnet 13 moves along the predetermined path and before it arrives at the end-point positions of both ends, it always pass through a deceleration position determined by the deceleration sensor previously, the deceleration position determined by the deceleration sensor may be adjusted along the predetermined path during the working procedure of the magnetron sputtering device.

For example, as illustrated in FIG. 6, a second sensor unit 21, which is provided before the first sensor unit 20 along the predetermined path in the sensor units, may be selectively activated as a deceleration sensor according to requirements. It should be noted that, the second sensor unit 21 is not the "second" sensor unit, but any suitable sensor unit that is selected according to requirements.

For example, as illustrated in FIG. 6, a side length of the magnet 13 in an extending direction of the predetermined path 14 is L, a distance between the second sensor unit 21 and the first sensor unit 20 is L/2 to 2L, the side length of the magnet 13 in the extending direction of the predetermined path is L. That is, the magnet 13 can be decelerated in a deceleration region with a length of L/2 to 2L, so as to prepare for standstill of the magnet 13 which arrives at the end-point position.

For example, as illustrated in FIG. 6, after the first sensor unit serving as a limit sensor works for a predetermined time period, a third sensor unit 22 in the sensor units may be selectively activated according to requirements, to replace the first sensor unit 20 as the limit sensor, so as to determine a new end-point position of the predetermined path along which the magnet 13 performs reciprocating motion. Correspondingly, a fourth sensor unit 23, which is provided before the third sensor unit 22 along the predetermined path in the sensor units can be activated according to requirements, to replace the second sensor unit 21 as a new deceleration sensor. It should also be noted that, the third sensor unit 22 is not the "third" sensor unit, but any suitable sensor unit that is selected according to requirements; and the fourth sensor unit 23 is not the "fourth" sensor unit, but any suitable sensor unit that is selected according to requirements.

For example, as illustrated in FIG. 6, a length value between the first sensor unit 20 and the third sensor unit 22 ranges from 0 to L, for example, L/2. A length value between the end-point positions of the predetermined path along which the magnet 13 performs reciprocating motion respectively determined by the first sensor unit 20 and the third sensor unit 22 is between 0 and L, for example, L/2, the determined end-point position can be adjusted along the predetermined path during the working procedure of the magnetron sputtering device in a case that the first sensor unit 20 and the third sensor unit 22 are used as the limit sensors. For example, in a case that any one of the sensor units selectively activated is used as a limit sensor, the end-point position of the magnet determined can be adjusted along the predetermined path during the working procedure of the magnetron sputtering device, and an adjusted length value ranges from 0 to L, for example, L/2. The descriptions of similar contents can refer to the above-described relevant contents, and detailed descriptions will be omitted herein.

For example, the magnetron sputtering device according to the embodiment of the present disclosure may further comprise a control module, and a working procedure of the magnetron sputtering device comprises: the control module (not shown) receives and analyzes a signal of a consumption amount of the target material or sends an instruction to the sensor unit according to a predetermined working time period, the first sensor receives the instruction and is selected to be activated according to the instruction, then the first sensor can determine the end-point position of the predetermined path along which the magnet 13 performs reciprocating motion. In a case that the first sensor receives the position signal of the magnet 13 and feeds back to the control module, the control module accepts and analyzes the signal fed back by the first sensor, and then sends an instruction to the magnet bearing section 11, to determine the motion state of the magnet. The signal of the consumption amount of the target material can be obtained according to a set sputtering power and a program set by a working time application, and the like.

Figure 7:
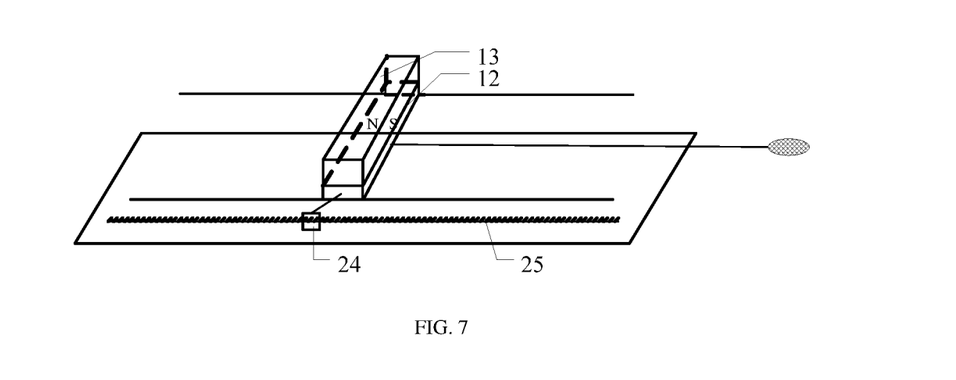
FIG. 7 is a structural schematic diagram of a magnetron sputtering device provided by an embodiment of the present disclosure.

At least one embodiment of the present disclosure still provides another magnetron sputtering device, for example, FIG. 7 is a structural schematic diagram of still another magnetron sputtering device provided by the embodiment of the present disclosure, the limit sensor comprises a displacement sensor 24 and a scale 25 provided in cooperation with the displacement sensor 24, and the displacement sensor 24 can perform reciprocating motion along the scale 25. The scale 25 is parallel to the predetermined path along which the magnet 13 performs reciprocating motion. For example, the limit sensor may be a grating sensor, a main grating is equivalent to the scale 25, and a subsidiary grating is equivalent to the displacement sensor 24.

For example, the displacement sensor 24 is connected with the magnet bearing section 12, and the displacement sensor 24 can perform synchronous reciprocating motion along the predetermined path with the magnet 13. For example, the magnetron sputtering device may comprise a control module, the control module receives and analyzes a signal of a consumption amount of the target material or sends an instruction to the limit sensor according to a predetermined working time period, the limit sensor receives the instruction, the displacement sensor 24 obtains a predetermined distance by which it will move along the predetermined path according to the instruction, and at the same time, a scribed line on the scale 25 can calibrate a distance by which the displacement sensor 24 moves, so that the limit sensor can determine the end-point position of the predetermined path along which the magnet 13 performs reciprocating motion. After the displacement sensor 24 moves by a predetermined distance in a direction parallel to the predetermined path, the control module receives and analyzes the signal fed back by the limit sensor, and then sends an instruction to the magnet bearing unit 11, to adjust a motion state of the magnet.

For example, the scale 25 is provided with a scribed line, for example, an adjacent ruling span (pitch) may be selected to be 1 µm to 10 µm. The ruling span reaching a micrometer scale, which makes the end-point position of the predetermined path along which the magnet 13 performs reciprocating motion determined by the limit sensor more accurate, according to a signal of a consumption amount of the target material or according to predetermined working time period, so as to better improve the uniformity of bombardment to the target material, and to prolong a service life of the target material.

For example, the scale 25 is provided with a scribed line corresponding to the end-point position of the predetermined path along which the magnet 13 performs reciprocating motion, and the scale 25 is also provided with a scribed line corresponding to the deceleration position. According to requirements, any scribed line on the scale may be selected to calibrate a standstill position or the deceleration position after the displacement sensor 23 moves by a predetermined distance.

At least one embodiment of the present disclosure provides a magnetron sputtering apparatus, and the magnetron sputtering apparatus comprises: a reaction chamber, and a magnetron sputtering device disposed in the reaction chamber and provided by any one of the above-mentioned embodiments. In the reaction chamber, during a procedure in which electrons, under an action of an electric field, accelerate and fly to a substrate, the electrons collide with argon atoms, with a large number of argon ions and electrons ionized out. The argon ions, under an action of the electric field, accelerate bombardment to the target material, sputtering out a large number of atoms of the target material, and the target atoms (or molecules) are deposited on the substrate to form a film. Secondary electrons ironized out by colliding with the argon atoms are affected by a Loren's magnetic force of a magnetic field during the procedure of accelerating and flying to the substrate, and are bounded within a plasma region close to a target surface, the secondary electrons, under an action of the magnetic field, perform a circular motion around the target surface, and in a course of motion, constantly collide with the argon atoms, with a large number of argon ions ionized out to bombard the target material. The magnetron sputtering apparatus can change a motion direction of the electrons by magnetic field restraining and extending a motion path of the electrons, and the magnetron sputtering apparatus can improve an ionization rate of a working gas, and effectively utilize energy of the electrons.

At the same time, any one of the above-described magnetron sputtering devices provided in the magnetron sputtering apparatus can determine the end-point position of reciprocating motion of the magnet by adjusting a position of the limit sensor, so as to improve uniformity of bombardment to the target material and to avoid waste caused by premature replacement of the target material, that is, to prolong a service life of the target material.

Figure 8:
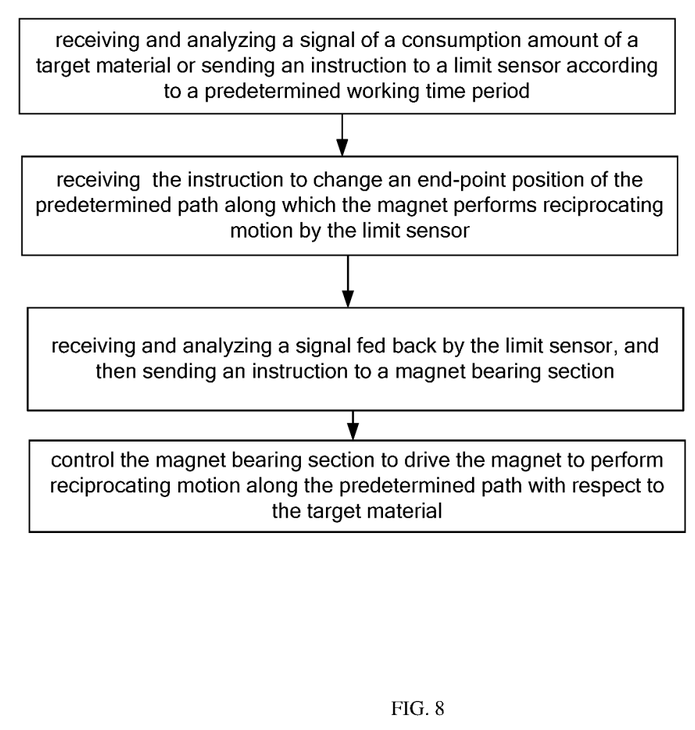
FIG. 8 is a procedure chart of a magnetron sputtering method provided by an embodiment of the present disclosure.

At least one embodiment of the present disclosure provides a magnetron sputtering method, FIG. 8 is a procedure chart of the magnetron sputtering method, and the magnetron sputtering method comprises the following operations: receiving and analyzing a signal of a consumption amount of the target material or sending an instruction to the limit sensor according to a predetermined working time period, to change an end-point position of the predetermined path along which the magnet performs reciprocating motion through the limit sensor by a control module; receiving and analyzing a signal fed back by the limit sensor, and then sending an instruction to the magnet bearing section, to control the magnet bearing section to drive the magnet to perform reciprocating motion along the predetermined path with respect to the target material by the control module; the end-point position determined by the limit sensor can be adjusted along the predetermined path during a working procedure of the magnetron sputtering device.

At least one embodiment of the present disclosure provides a magnetron sputtering device, a magnetron sputtering apparatus, and a magnetron sputtering method. The magnetron sputtering device can determine the end-point position of the reciprocating motion of the magnet by adjusting the position of the limit sensor, so as to improve uniformity of bombardment to the target material and to avoid waste caused by premature replacement of the target material, that is, to prolong the service life of the target material.

There are also some points to be illustrated in the present disclosure:

(1) Drawings of the embodiments of the present disclosure only refer to structures related with the embodiments of the present disclosure, and other structures may refer to general design.

(2) In order to make it clear, in the drawings for illustrating the embodiment of the present disclosure, various components are magnified or reduced, that is, those drawings are not drawn according to actual proportion.

(3) In case of no conflict, the embodiments of the present disclosure and the features of the embodiments may be combined with each other to form new embodiments.

What are described above is related to the illustrative embodiments of the disclosure only and not limitative to the scope of the disclosure; the scopes of the disclosure are defined by the accompanying claims.

The present application claims priority of the Chinese Patent Application No. 201610282313.X filed on Apr. 29, 2016, the entire disclosure of which is incorporated herein by reference as part of the present application.

What is claimed is:

1. A magnetron sputtering device, comprising:
   a target material bearing portion, configured to bear a target material thereon;
   a magnet bearing section, configured to bear a magnet thereon and to be capable of driving the magnet to perform reciprocating motion along a predetermined path with respect to the target material bearing portion; and
   a limit sensor, configured to determine an end-point position of the predetermined path along which the magnet performs reciprocating motion;
   wherein the end-point position determined by the limit sensor can be adjusted along the predetermined path during a working procedure of the magnetron sputtering device; and
   the limit sensor is set to be movable so as to change the position of the limit sensor with respect to the predetermined path.

2. The magnetron sputtering device according to claim 1, wherein an adjusted length value of the end-point position determined by the limit sensor along the predetermined path during the working procedure of the magnetron sputtering device is L/2 where L is a side length of the magnet in an extending direction of the predetermined path.

3. The magnetron sputtering device according to claim 1, further comprising:
   a first driving unit, configured to provide a driving force for the movement of the limit sensor; and
   a connecting part, connected with the first driving unit and the limit sensor.

4. The magnetron sputtering device according to claim 3, wherein the first driving unit comprises a rotating motor or a gear, and the connecting part comprises a lead screw or a rack correspondingly, and
   the limit sensor is provided on the lead screw or the rack.

5. The magnetron sputtering device according to claim 3, wherein the first driving unit comprises a linear motor or an air cylinder or a hydraulic cylinder of variable stroke, and the connecting part comprises a telescopic rod, and the limit sensor is disposed on the telescopic rod.

6. The magnetron sputtering device according to claim 1, further comprising a deceleration sensor,
   wherein the deceleration sensor is disposed on the predetermined path and is located before the end-point position.

7. The magnetron sputtering device according to claim 1, wherein the limit sensor comprises a displacement sensor and a scale provided in cooperation with the displacement sensor, and the displacement sensor can perform reciprocating motion along the scale.

8. The magnetron sputtering device according to claim 7, wherein the scale is provided with a scribed line corresponding to the end-point position of the predetermined path along which the magnet performs reciprocating motion.

9. The magnetron sputtering device according to claim 8, wherein the scale is further provided with a scribed line corresponding to a deceleration position.

10. The magnetron sputtering device according to claim 3, further comprising a control module, wherein
    the control module is configured to:
        receive and analyze a signal of a consumption amount of the target material or send an instruction to the limit sensor according to a predetermined working time period, to change the end-point position determined by the limit sensor, and
        receive and analyze a signal fed back by the limit sensor, and send an instruction to the magnet bearing section.

11. A magnetron sputtering apparatus, comprising:
    a reaction chamber, and
    a magnetron sputtering device disposed in the reaction chamber according to claim 1.

12. A magnetron sputtering method, comprising:
    receiving and analyzing a signal of a consumption amount of a target material or sending an instruction to a limit sensor according to a predetermined working time period, moving the limit sensor to change an end-point position of a predetermined path along which a magnet performs reciprocating motion through the limit sensor by a control module; and
    receiving and analyzing a signal fed back by the limit sensor, and then sending an instruction to a magnet bearing section, to control the magnet bearing section to drive the magnet to perform reciprocating motion along the predetermined path with respect to the target material by the control module;
    wherein the end-point position determined by the limit sensor can be adjusted along the predetermined path during a working procedure of the magnetron sputtering device.

* * * * *